United States Patent
Watanabe et al.

(10) Patent No.: US 9,947,862 B2
(45) Date of Patent: Apr. 17, 2018

(54) MAGNETORESISTIVE MEMORY DEVICE

(71) Applicant: Toshiba Memory Corporation, Minato-ku, Tokyo (JP)

(72) Inventors: Daisuke Watanabe, Seoul (KR); Toshihiko Nagase, Seoul (KR); Youngmin Eeh, Seongnam-si (KR); Kazuya Sawada, Seoul (KR); Makoto Nagamine, Seoul (KR); Tadaaki Oikawa, Seoul (KR); Kenichi Yoshino, Seoul (KR); Hiroyuki Ohtori, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/268,507

(22) Filed: Sep. 16, 2016

(65) Prior Publication Data
US 2017/0263857 A1 Sep. 14, 2017

Related U.S. Application Data

(60) Provisional application No. 62/308,156, filed on Mar. 14, 2016.

(51) Int. Cl.
*H01L 43/08* (2006.01)
*H01L 43/02* (2006.01)
*G11C 11/16* (2006.01)
*H01L 43/10* (2006.01)
*H01L 27/22* (2006.01)

(52) U.S. Cl.
CPC ............ *H01L 43/08* (2013.01); *G11C 11/161* (2013.01); *H01L 27/222* (2013.01); *H01L 43/02* (2013.01); *H01L 43/10* (2013.01)

(58) Field of Classification Search
CPC ....... H01L 27/22; H01L 27/222; H01L 43/02; H01L 43/04; H01L 43/08; H01L 43/10
See application file for complete search history.

(56) References Cited

U.S. PATENT DOCUMENTS

| | | |
|---|---|---|
| 6,710,986 B1 | 3/2004 | Sato et al. |
| 7,750,390 B2 | 7/2010 | Saito et al. |
| 8,125,745 B2 | 2/2012 | Inomata et al. |
| 8,329,478 B2 | 12/2012 | Shi et al. |
| 8,520,433 B1 | 8/2013 | Kato et al. |
| 8,710,604 B2 | 4/2014 | Yamakawa et al. |
| 9,178,133 B2 | 11/2015 | Kitagawa et al. |
| 2012/0070695 A1 | 3/2012 | Kitagawa et al. |

(Continued)

FOREIGN PATENT DOCUMENTS

| | | |
|---|---|---|
| JP | 2015126221 A | 7/2015 |
| JP | 2015176930 A | 10/2015 |
| JP | 2015176931 A | 10/2015 |

*Primary Examiner* — Cuong Q Nguyen
(74) *Attorney, Agent, or Firm* — Holtz, Holtz & Volek PC

(57) ABSTRACT

According to one embodiment, a magnetoresistive memory device includes a first magnetic layer in which a magnetization direction is variable, a first nonmagnetic layer provided on the first magnetic layer, a second magnetic layer provided on the first nonmagnetic layer, a magnetization direction of the second magnetic layer being invariable, and a second nonmagnetic layer provided on the first magnetic layer, which is opposite the first nonmagnetic layer. The first magnetic layer includes Mo.

21 Claims, 18 Drawing Sheets

(56) References Cited

U.S. PATENT DOCUMENTS

| | | | |
|---|---|---|---|
| 2014/0131823 A1* | 5/2014 | Nagase | H01L 43/08 257/421 |
| 2014/0284539 A1 | 9/2014 | Eeh et al. | |
| 2016/0013397 A1 | 1/2016 | Kitagawa et al. | |
| 2016/0197266 A1 | 7/2016 | Kitagawa et al. | |
| 2016/0260890 A1* | 9/2016 | Guo | H01L 43/08 |

* cited by examiner

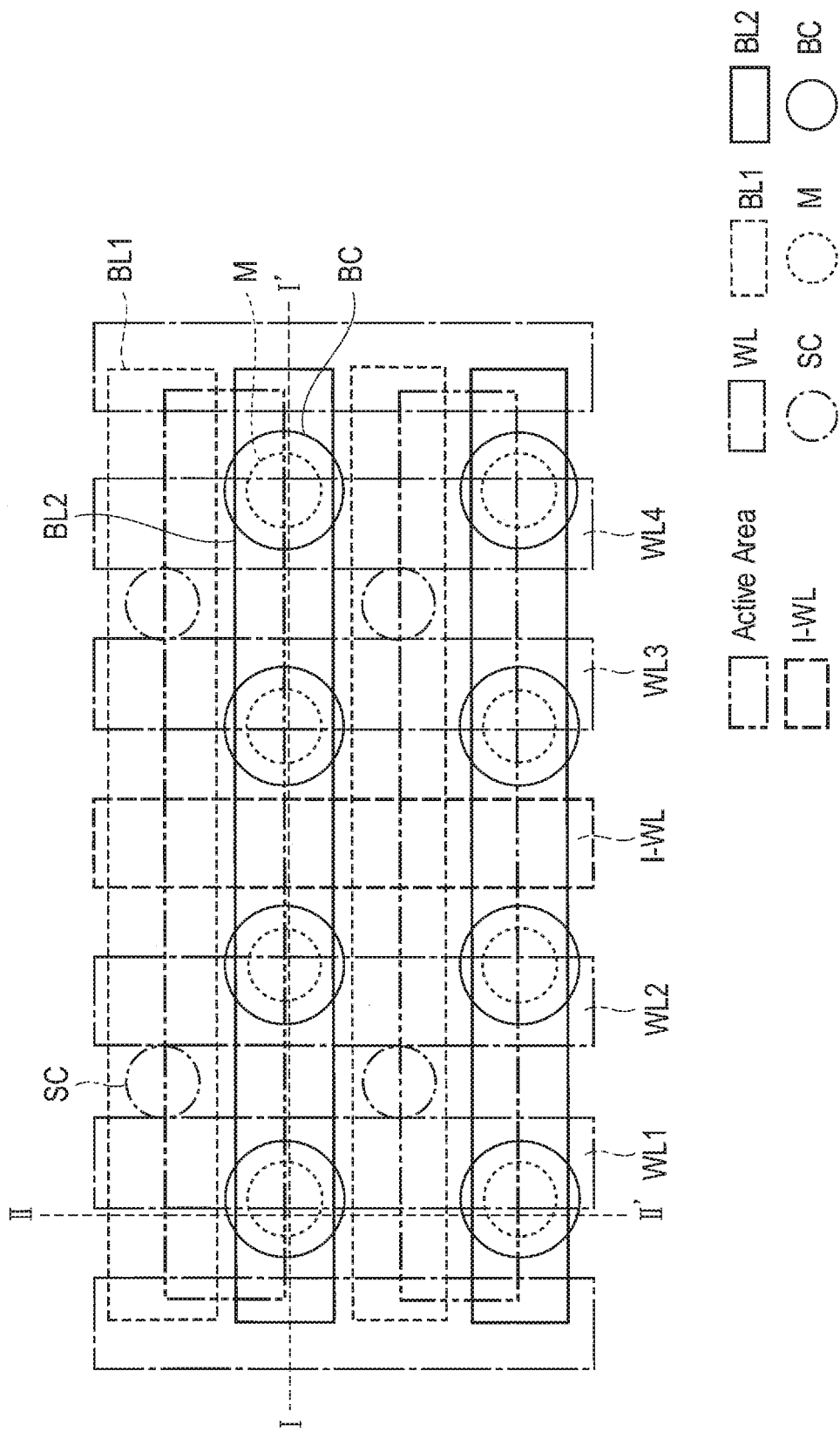
F I G. 1

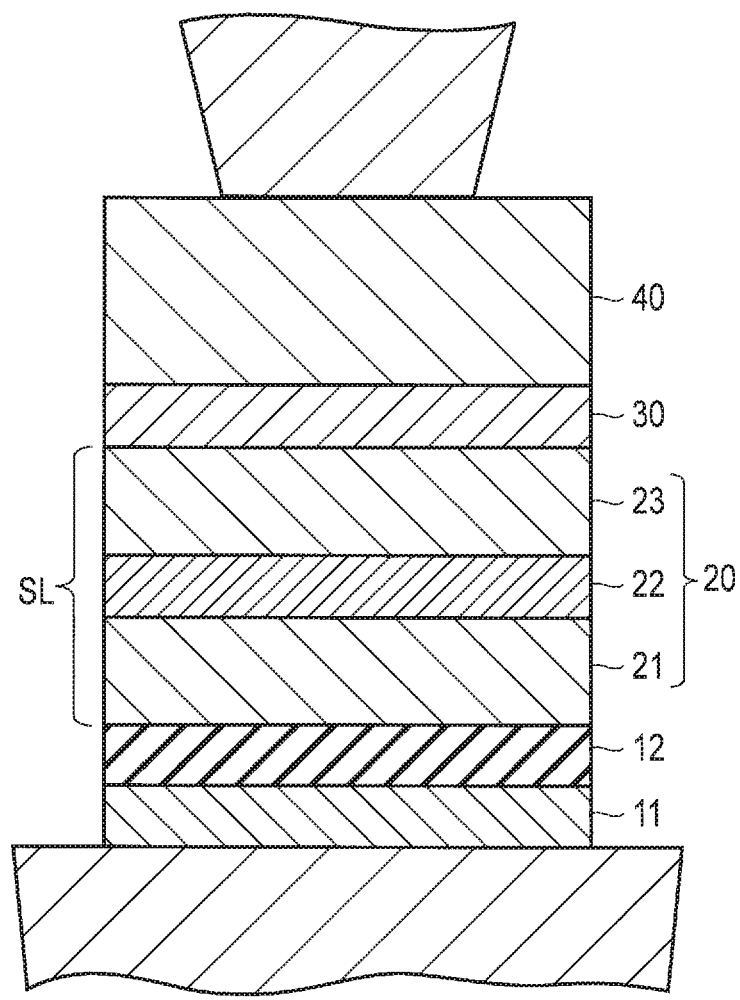
F I G. 4

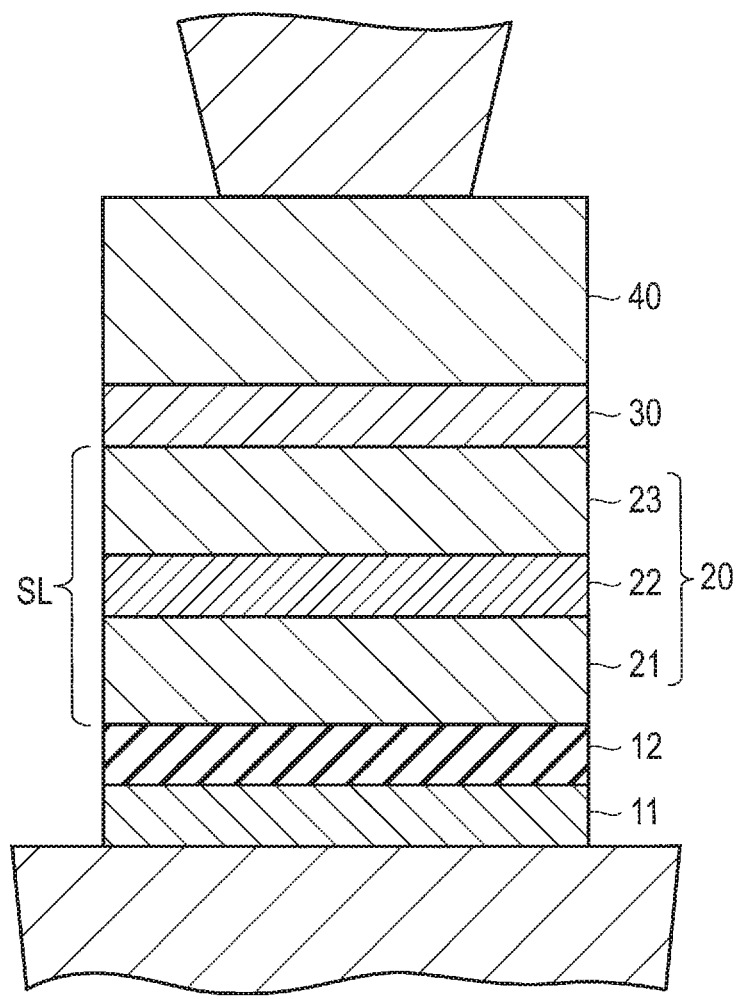
F I G. 10

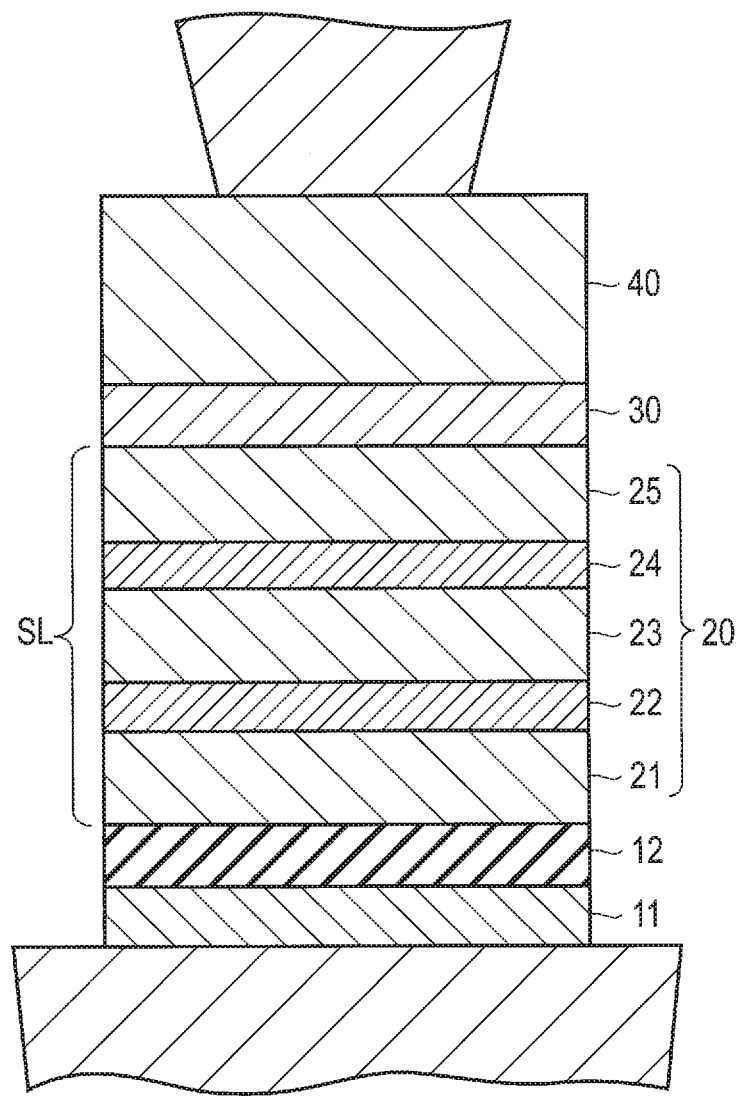
F I G. 11

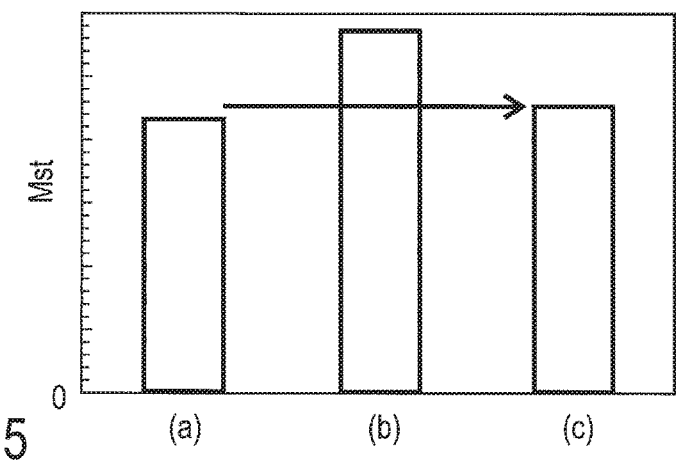
F I G. 15
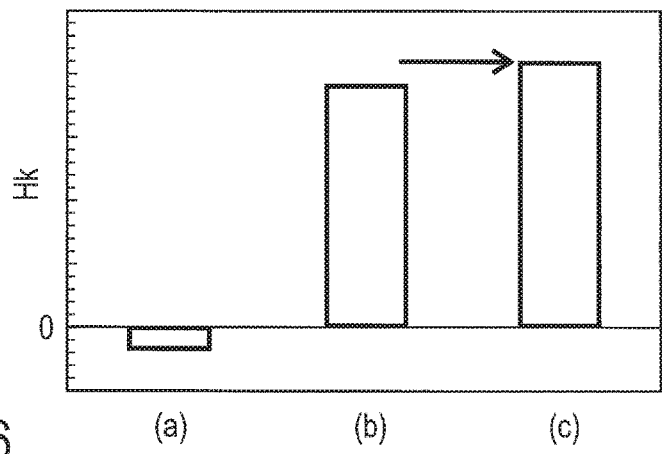
F I G. 16
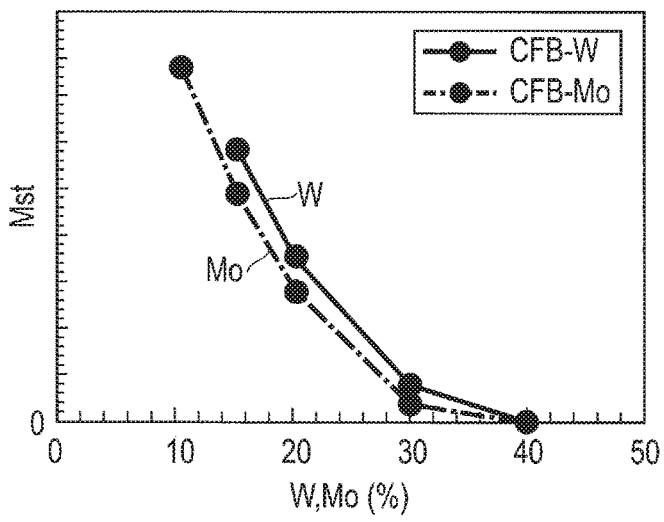
F I G. 17

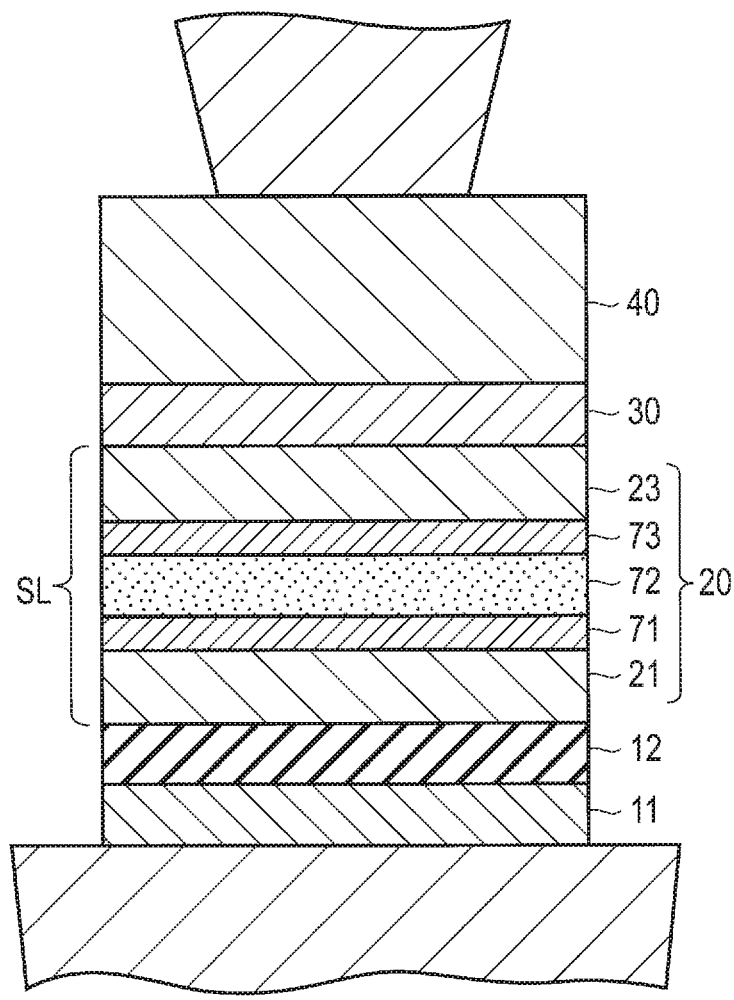
F I G. 20

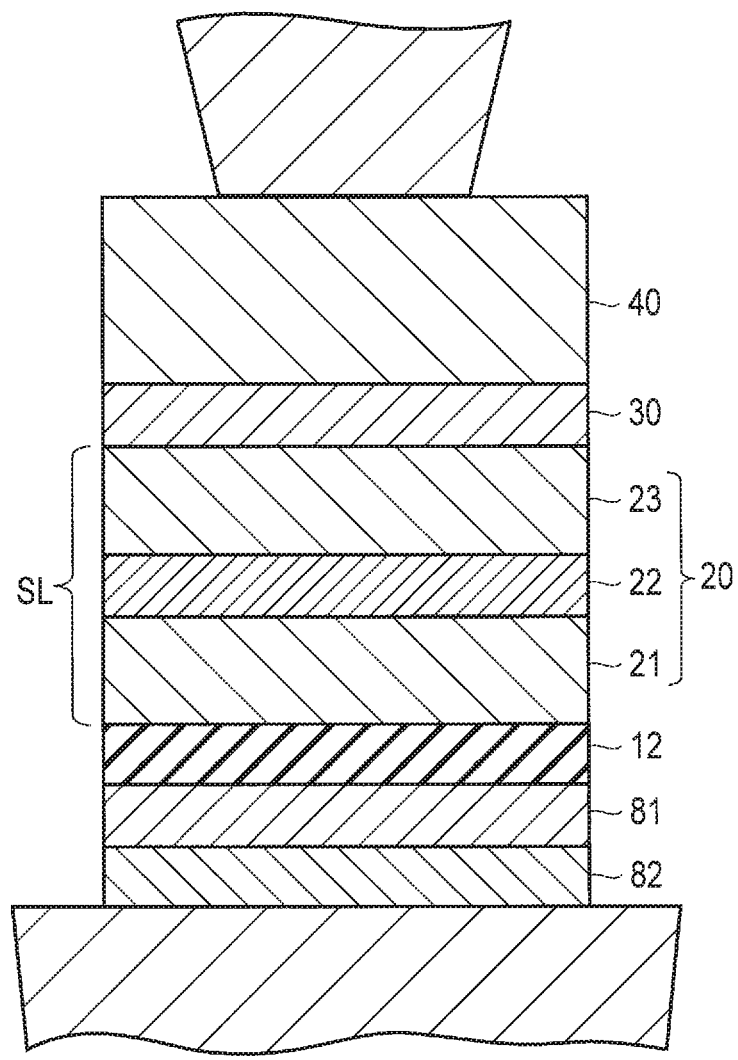
F I G. 23

MAGNETORESISTIVE MEMORY DEVICE

CROSS-REFERENCE TO RELATED APPLICATIONS

This application claims the benefit of U.S. Provisional Application No. 62/308,156, filed Mar. 14, 2016, the entire contents of which are incorporated herein by reference.

FIELD

Embodiments described herein relate generally to a magnetoresistive memory device.

BACKGROUND

Recently, there are expectations and attention on a large-capacity magnetoresistive random access memory (MRAM) in which a magnetic tunnel junction (MTJ) element is used. In the MTJ element, one of the two magnetic layers which sandwich a tunnel barrier layer is formed as a magnetization fixed layer (a reference layer) in which the direction of magnetization is fixed to be invariable, and the other magnetic layer is formed as a magnetization free layer (a storage layer) in which the direction of magnetization is made to be easily reversed.

BRIEF DESCRIPTION OF THE DRAWINGS

FIG. 1 is a plan view which schematically illustrates a magnetoresistive memory device according to a first embodiment.

FIG. 4 is a cross-sectional view showing a structure of a memory cell portion of the magnetoresistive memory device of the first embodiment.

FIG. 10 is a cross-sectional view showing a structure of a memory cell portion of a magnetoresistive memory device of a second embodiment.

FIG. 11 is a cross-sectional view showing a structure of a memory cell portion of a magnetoresistive memory device of a third embodiment.

FIG. 15 is a characteristic diagram showing a change in saturation magnetization Mst when a buffer layer is varied.

FIG. 16 is a characteristic diagram showing a change in an anisotropic magnetic field Hk when the buffer layer is varied.

FIG. 17 is a characteristic diagram showing a change in the saturation magnetization Mst with respect to a ratio of W or Mo added to CFB.

FIG. 20 is a cross-sectional view showing a modification of the fifth embodiment.

FIG. 23 is a cross-sectional view showing a structure of an MTJ element portion used in a magnetoresistive memory device according to a sixth embodiment.

DETAILED DESCRIPTION

In general, according to one embodiment, a magnetoresistive memory device comprises: a first magnetic layer in which a magnetization direction is variable; a first nonmagnetic layer provided on the first magnetic layer, the first magnetic layer including Mo; a second magnetic layer provided on the first nonmagnetic layer, a magnetization direction of the second magnetic layer being invariable; and a second nonmagnetic layer provided on the first magnetic layer, which is opposite the first nonmagnetic layer.

First Embodiment

Figure 2:
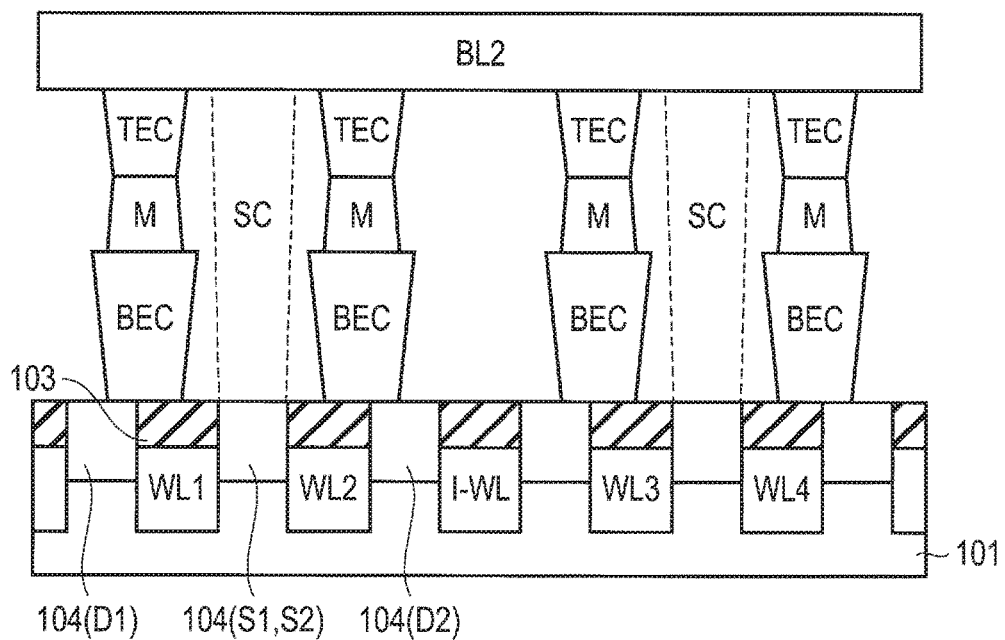
FIG. 2 is a cross-sectional view taken along line I-I' of FIG. 1.
Figure 3:
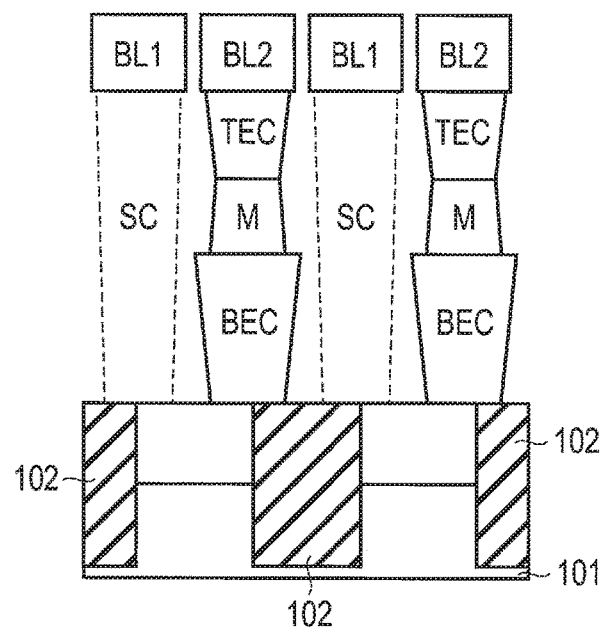
FIG. 3 is a cross-sectional view taken along line II-II' of FIG. 1.

FIG. 1 is a plan view which schematically illustrates a magnetoresistive memory device according to a first embodiment. FIG. 2 is a cross-sectional view taken along line I-I' of FIG. 1, and FIG. 3 is a cross-sectional view taken along line II-II' of FIG. 1. A member indicated by a broken line in FIGS. 2 and 3 represents a plug SC at the back side which cannot be seen in the I-I' and II-II' cross-sections.

The magnetoresistive memory device of the present embodiment is an MRAM comprising an MTJ element (a magnetoresistive element) of a spin-transfer-torque writing method as a storage element. A perpendicular magnetization film is used in the above MTJ element. The perpendicular magnetization film is a magnetization film in which the direction of magnetization (direction of axis of easy magnetization) is substantially perpendicular to the film plane of the perpendicular magnetization film.

In the drawings, 101 indicates a silicon substrate (a semiconductor substrate), and an element isolation region 102 is formed on a surface of the silicon substrate 101. The element isolation region 102 defines an active region.

The MRAM of the present embodiment comprises a first select transistor in which a gate electrode is word line WL1, a first MTJ element M which is connected to source/drain region 104 (drain region D1) on one side of the first select transistor, a second select transistor in which a gate electrode is word line WL2, and a second MTJ element M which is connected to source/drain region 104 (drain region D2) on one side of the second select transistor. In the drawing, 103 indicates a protective insulating film. That is, a memory cell of the present embodiment is constituted of an MTJ (a storage element) and a select transistor, and two select transistors of the adjacent two memory cells share source/drain region 104 (source regions S1, S2), which is the source/drain region on the other side.

A gate (a gate insulating film and a gate electrode) of the select transistor of the present embodiment is buried in a surface of the silicon substrate 101. That is, the gate of the present embodiment has a buried gate (BG) structure. Similarly, a gate (word line WL) for element isolation has the BG structure.

Source/drain region 104 (D1) on one side of the first select transistor is connected to the lower part of the first MTJ element M via a bottom electrode BEC. The upper part of the first MTJ element M is connected to a bit line BL2 via a top electrode TEC. Source/drain region 104 (S1) on the other side of the first select transistor is connected to bit line BL1 via the plug SC.

In the present embodiment, while a planar pattern of each of the bottom electrode BEC, the MTJ element M, the top electrode TEC, and the plug SC is circular, they may be formed in another shape.

Source/drain region 104 (D2) on one side of the second select transistor is connected to the lower part of the second MTJ element M via a bottom electrode BEC. The upper part of the second MTJ element M is connected to bit line BL2 via a top electrode TEC. Source/drain region 104 (S2) on the other side of the second select transistor is connected to bit line BL1 via the plug SC.

The first select transistor, the first MTJ element M, the second select transistor, and the second MTJ element M (i.e., two memory cells) are provided in every active region. The two adjacent active regions are separated from each other by the element isolation region 102.

Word lines WL3 and WL4 correspond to word lines WL1 and WL2, respectively. Accordingly, two memory cells are constituted by a first select transistor in which word line WL3 is a gate, a first MTJ element M which is connected to a source/drain region on one side of the first select transistor, a second select transistor in which word line WL4 is a gate, and a second MTJ element M which is connected to a source/drain region on one side of the second select transistor.

Note that the layout of the MTJ element, BL, WL, etc., is in no way limited to the illustration of FIGS. 1 to 3. For example, BL2 may be arranged at a lower layer than BL1. Further, an active region may be inclined with respect to a gate electrode.

FIG. 4 is a cross-sectional view showing a specific structure of an MTJ element portion employed in the present embodiment.

On the bottom electrode (BEC) connected to the drain region of the select transistor, an underlayer (UL [second nonmagnetic layer]) 12 is formed via a buffer layer 11 (BuL). As the buffer layer 11, Al, Be, Mg, Ca, Sr, Ba, Sc, Y, La, Si, Zr, Hf, W, Cr, Mo, Nb, Ti, Ta, V, etc., may be used. Also, a boride of the above elements may be included.

The boride is not limited to a binary compound consisting of two elements, but may be a ternary compound consisting of three elements. That is, the boride may be a mixture of a binary compound. For instance, examples of such a boride are HfB, MgAlB, HfAlB, ScAlB, ScHfB, and HfMgB. Further, the aforementioned materials may be stacked.

The underlayer 12 may be a nitrogen compound or an oxygen compound such as MgN, ZrN, NbN, SiN, AlN, HfN, TaN, WN, CrN, MoN, TiN, VN, and MgO, or a mixture of these compounds. That is, the underlayer 12 is not limited to a binary compound consisting of two elements, but may be a ternary compound consisting of three elements such as aluminum titanium nitride (AlTiN).

The nitrogen compound and the oxygen compound suppress an increase in a damping constant of a magnetic layer which is in contact with these compounds, and an advantage of reducing write current can be obtained. Further, by using a nitrogen compound or an oxygen compound of high-melting-point metal, it is possible to suppress diffusion of an underlayer material into a magnetic layer and prevent deterioration of an MR ratio. Here, a high-melting-point metal is a material having a higher melting point than Fe or Co, and is, for example, Zr, Hf, W, Cr, Mo, Nb, Ti, Ta, and V.

When a nitrogen compound or an oxygen compound is used as the underlayer 12, the magnetic anisotropy of a storage layer 20, described later, can be greatly improved. That is, by using MgO, for example, for the underlayer 12 and a tunnel barrier layer (TB) 30, the storage layer 20 is sandwiched between layers of MgO. Accordingly, at the interface between the storage layer 20 and the underlayer 12, and the interface between the storage layer 20 and the tunnel barrier layer 30, the interfacial anisotropy can be developed, and perpendicular magnetic anisotropy of the storage layer 20 can be doubled in principle.

On the underlayer 12, the storage layer 20 (SL [first magnetic layer]) in which a middle layer 22 is sandwiched between magnetic material layers 21 and 23 is formed. That is, the storage layer 20 in which three layers 21, 22, and 23 are stacked is formed. Each of the magnetic material layers 21 and 23 is an alloy including Fe and Co, and further, B, may be included. Further, the middle layer 22 includes Mo. Here, since Mo is a material which has a higher melting point than the magnetic material layers 21 and 22, and is hard to oxidize, it is suitable as the material used for the middle layer 22.

On the storage layer 20, a reference layer 40 (RL [second magnetic layer]) is formed via the tunnel barrier layer (first nonmagnetic layer) 30. After these layers 11, 12, 20, 30, and 40 have been stacked on the BEC, by selectively etching the layers by ion beam etching (IBE) or reactive ion etching (RIE), etc., they are processed into a cell pattern. Further, the top electrode (TEC) is formed on the reference layer 40.

The storage layer 20 has magnetic anisotropy perpendicular to a film surface, and a magnetization direction is variable. The magnetic material layers 21 and 23 of the storage layer 20 are not limited to CoFeB, and various magnetic materials can be used. For example, CoB or FeB can also be used.

If the middle layer 22 has a great film thickness, magnetic coupling between the magnetic material layers 21 and 23 may be cut. Accordingly, the film thickness of the middle layer 22 must be set within a range that allows the magnetic material layers 21 and 23 to be magnetically coupled. For example, the film thickness should preferably be 0.5 nm or less. Since Mo is a material which has a higher melting point than CoFeB, and is also hard to oxidize, this material does not cause unnecessary diffusion in annealing, or decrease the MR ratio.

Figure 5:
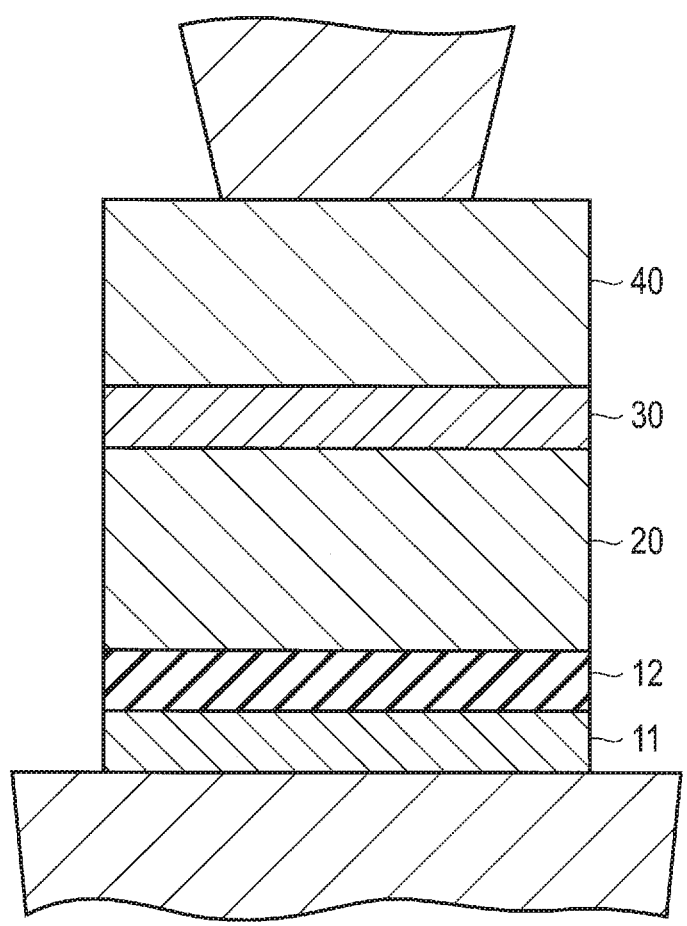
FIG. 5 is a cross-sectional view showing a structure of a memory cell portion according to a modification of the first embodiment.

Also, the middle layer 22 is not necessarily limited to a single layer of Mo. It is sufficient if the storage layer 20 includes magnetic materials such as Fe and Co, and Mo. For example, a structure in which a layer including Mo is inserted into a part of the storage layer 20 of CoFeB, or a single-layer alloy of CoFeBMo, for example, as shown in FIG. 5, may be adopted.

The tunnel barrier layer 30 is a layer for passing a tunneling current, and various nonmagnetic materials can be used. In the present embodiment, while the tunnel barrier layer 30 is formed of MgO, an oxide including Cu, Si, Ba, Ca, La, Mn, Zn, Hf, Ta, Ti, B, Cr, V or Al can also be used.

The reference layer 40 is an alloy including Fe and Co, for example, and may be CoFeB further including B. The reference layer 40 has magnetic anisotropy perpendicular to a film surface, and a magnetization direction is fixed. The material of the reference layer 40 is not limited to CoFeB, and various magnetic materials can be used. For example, CoPt, CoNi, CoPd, etc., can be used. Further, Fe/Pt (a superlattice structure formed by a stacked layer structure of Fe and Pt), Fe/Pd, Co/Pt, and Co/Pd can be used.

Figure 6:
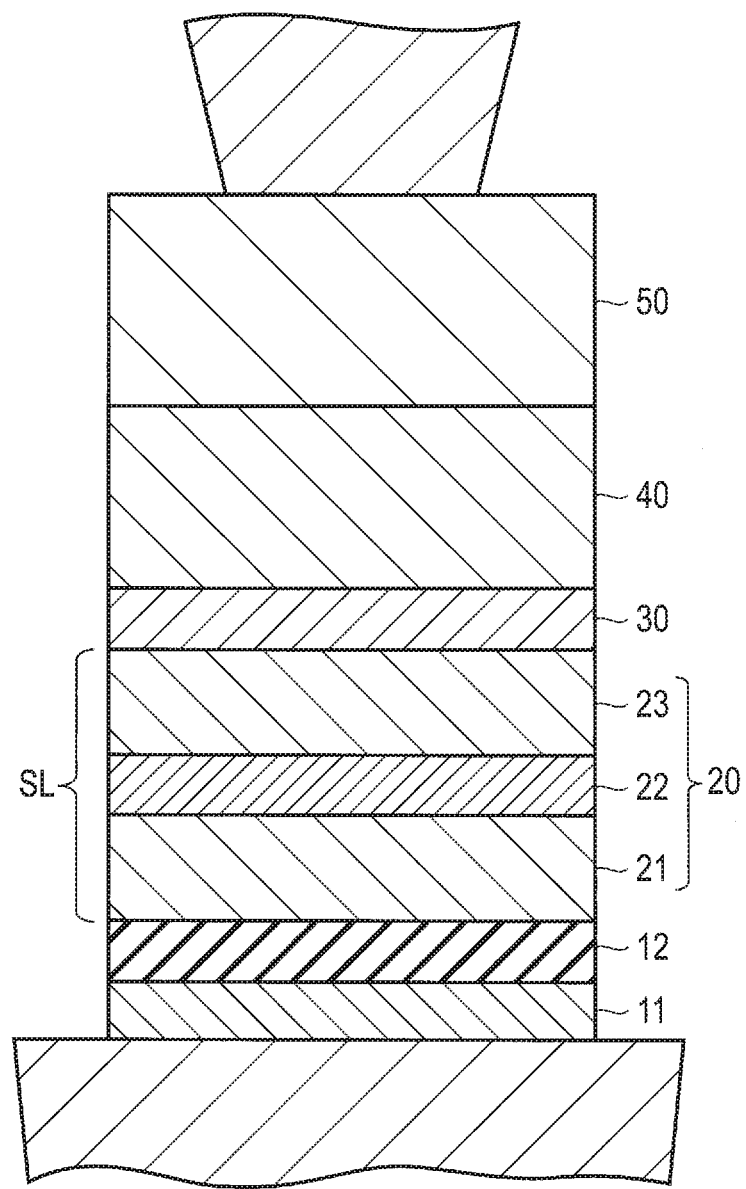
FIG. 6 is a cross-sectional view showing a structure of a memory cell portion according to another modification of the first embodiment.

Further, as shown in FIG. 6, in order to cancel or reduce a stray magnetic field, a shift canceling layer 50 having a magnetization direction opposite to that of the reference layer 40 may be provided on the reference layer 40. As the material of the shift canceling layer 50, various magnetic materials can be used likewise the reference layer 40.

Figure 7:
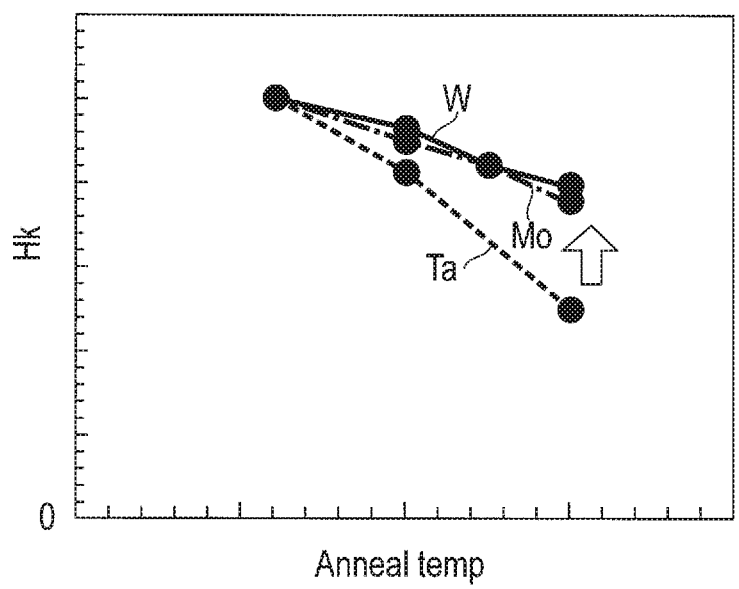
FIG. 7 is a characteristic diagram showing the relationship between annealing temperature T and anisotropic magnetic field Hk.

FIG. 7 is a graph showing the relationship between annealing temperature T and anisotropic magnetic field Hk. As shown in FIG. 7, the higher the annealing temperature is, the smaller the magnetic anisotropy of the storage layer 20 becomes. However, in cases where the middle layer 22 is formed of W and Mo, respectively, the annealing temperature dependence is lower than that of a case where the middle layer 22 is formed of Ta. Further, when a high-temperature annealing process is performed, W and Mo have greater magnetic anisotropy than Ta.

Figure 8:
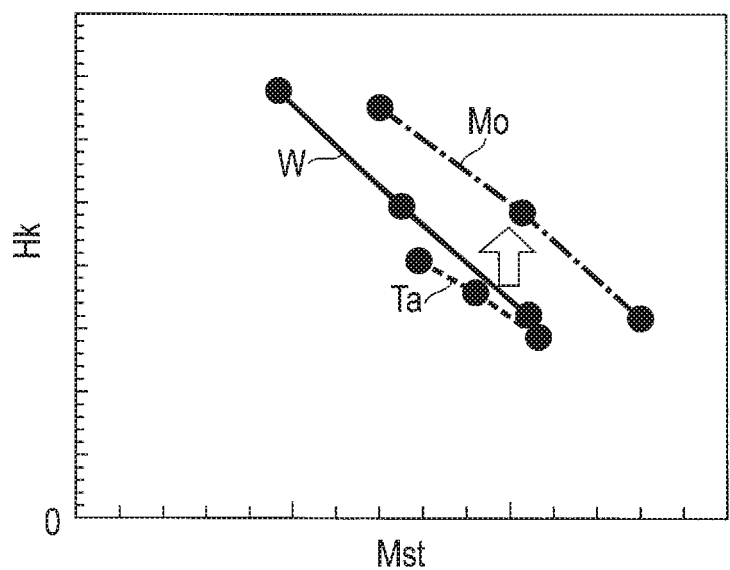
FIG. 8 is a characteristic diagram showing the relationship between saturation magnetization Mst and anisotropic magnetic field Hk.

FIG. 8 is a graph showing the relationship between saturation magnetization Mst and anisotropic magnetic field Hk of the storage layer 20 when the MTJ element portion is annealed. As shown in FIG. 8, the greater the saturation magnetization Mst is, the smaller the magnetic anisotropy of the storage layer 20 becomes. Also, greater magnetic anisotropy can be obtained with Mo as compared to Ta and W.

As in the present embodiment, by using Mo as the material of the middle layer 22 of the storage layer 20, improvement in the thermal resistance can be achieved. In addition, if the same material, i.e., MgO, is used for the underlayer 12 and the tunnel barrier layer 30, the MgO—CoFeB interfacial anisotropy can be developed from both of the two interfaces of the storage layer 20, and perpendicular magnetic anisotropy of the storage layer 20 can be doubled in principle. As a result, thermal stability (Δ) and reduction of write current can be achieved. This advantage becomes more significant when the film thickness of the storage layer 20 is increased.

Here, since a single layer of CoFeB sandwiched between MgO layers is hard to crystallize, Ta has been considered as the middle layer which absorbs B and promotes crystallization. However, since the thermal resistance is low in the middle layer of Ta, perpendicular magnetic anisotropy may be degraded by a high-temperature heat treatment whereby a high TMR can be obtained.

In contrast, in the present embodiment, by using Mo instead of Ta, thermal resistance is greatly improved, and greater perpendicular magnetic anisotropy than when a Ta middle layer is used in a high-temperature heat treatment is realized. Preferably, the thickness of an Mo film of the middle layer should be 5 Å at a maximum which allows magnetic coupling between two magnetic layers.

Also, when the middle layer 20 is formed of Mo, an advantage that an anisotropic magnetic field Hk can be more increased with an oxide underlayer (MgO) than with a nitride underlayer (AlN) is obtained.

Figure 9:
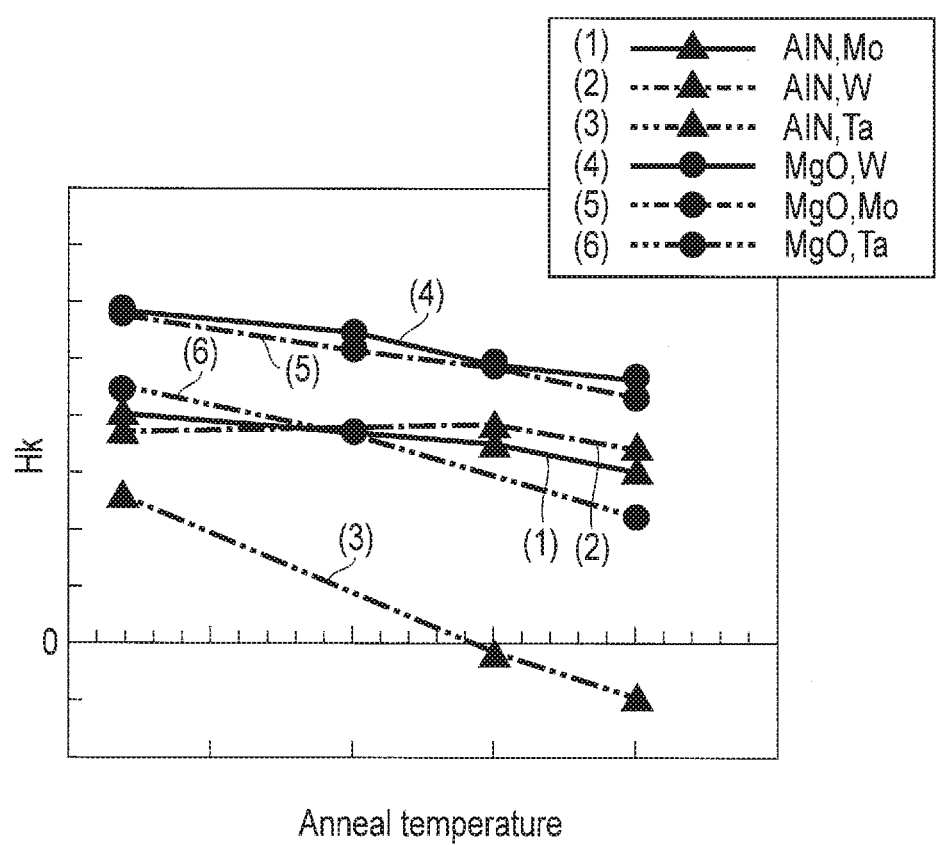
FIG. 9 is a characteristic diagram showing the relationship between the annealing temperature and anisotropic magnetic field Hk.

FIG. 9 is a characteristic diagram showing the relationship between the annealing temperature and the anisotropic magnetic field Hk of the storage layer 20. In FIG. 9, (1) corresponds to a case where the underlayer is formed of AlN and the middle layer is formed of Mo, (2) corresponds to a case where the underlayer is formed of AlN and the middle layer is formed of W, (3) corresponds to a case where the underlayer is formed of AlN and the middle layer is formed of Ta, (4) corresponds to a case where the underlayer is formed of MgO and the middle layer is formed of W, (5) corresponds to a case where the underlayer is formed of MgO and the middle layer is formed of Mo, and (6) corresponds to a case where the underlayer is formed of MgO and the middle layer is formed of Ta. As can be seen from this diagram, when the middle layer is formed of Mo, regardless of the annealing temperature, the anisotropic magnetic field Hk is increased when MgO is used for the underlayer. Therefore, when the middle layer 20 is formed of Mo, it is preferable that an oxide such as MgO, instead of a nitride such as AlN, be used as the underlayer 12. This also applies to a case where the storage layer 20 is a single-layer alloy including Mo, as shown in FIG. 5.

As can be seen, according to the present embodiment, by using Mo as the material of the middle layer 22 of the storage layer 20 having a three-layer structure, it is possible to improve the magnetic anisotropy of the storage layer 20, and also to improve the thermal resistance. Moreover, when Mo is used for the middle layer 22, by using an oxide such as MgO as the underlayer 12, there is also an advantage that the anisotropic magnetic field Hk can further be increased. Accordingly, a magnetoresistive memory device having good magnetic properties and thermal resistance can be realized.

Second Embodiment

FIG. 10 is a cross-sectional view showing the structure of an MTJ element portion used in a magnetoresistive memory device according to a second embodiment. It should be noted that the same portions as those of FIG. 4 will be given the same reference numbers, and detailed explanations of them will be omitted.

The point in which the present embodiment is different from the first embodiment described above is that a nitrogen compound is used for an underlayer 12, and Mo or W is used for a middle layer 22 of a storage layer 20. Here, the nitrogen compound is the same as that described in the first embodiment, and is, for example, MgN, ZrN, NbN, SiN, AlN, HfN, TaN, WN, CrN, MoN, TiN, or VN, or a mixture of the aforementioned materials. That is, the underlayer 12 is not limited to a binary compound consisting of two elements, but may be a ternary compound consisting of three elements such as aluminum titanium nitride (AlTiN). As described in the first embodiment, even in a case where the nitrogen compound is used for the underlayer 12, interfacial anisotropy of CoFeB can be developed from both of the two interfaces of the storage layer 20, and perpendicular magnetic anisotropy of the storage layer 20 can be increased. Further, when a nitrogen compound is used as the underlayer 12, an advantage of reducing a damping constant and reducing write current can also be obtained. Also, since each of Mo and W is a material which has a higher melting point than magnetic material layers 21 and 22, and is harder to oxidize than Ta, Mo and W are suitable as the materials used for the middle layer 22.

Note that the middle layer 22 is not necessarily limited to a single layer of Mo or W. It is sufficient if the storage layer 20 includes magnetic materials such as Fe and Co, and Mo or W. For example, a structure in which a layer including W is inserted into the storage layer 20 of CoFeB, or an alloy of CoFeBW, for example, may be adopted.

As can be seen, according to the present embodiment, by using a nitrogen compound as the underlayer 12 of the storage layer 20, and using Mo or W as the material of the middle layer 22 of the storage layer 20, it is possible to improve the magnetic anisotropy of the storage layer 20, and also to improve the thermal resistance. Accordingly, an advantage similar to that of the first embodiment can be obtained. Further, an advantage of reducing a damping constant and reducing write current can also be obtained.

Third Embodiment

FIG. 11 is a cross-sectional view showing the structure of an MTJ element portion used in a magnetoresistive memory device according to a third embodiment. It should be noted that the same portions as those of FIG. 4 will be given the same reference numbers, and detailed explanations of them will be omitted.

Figure 12:
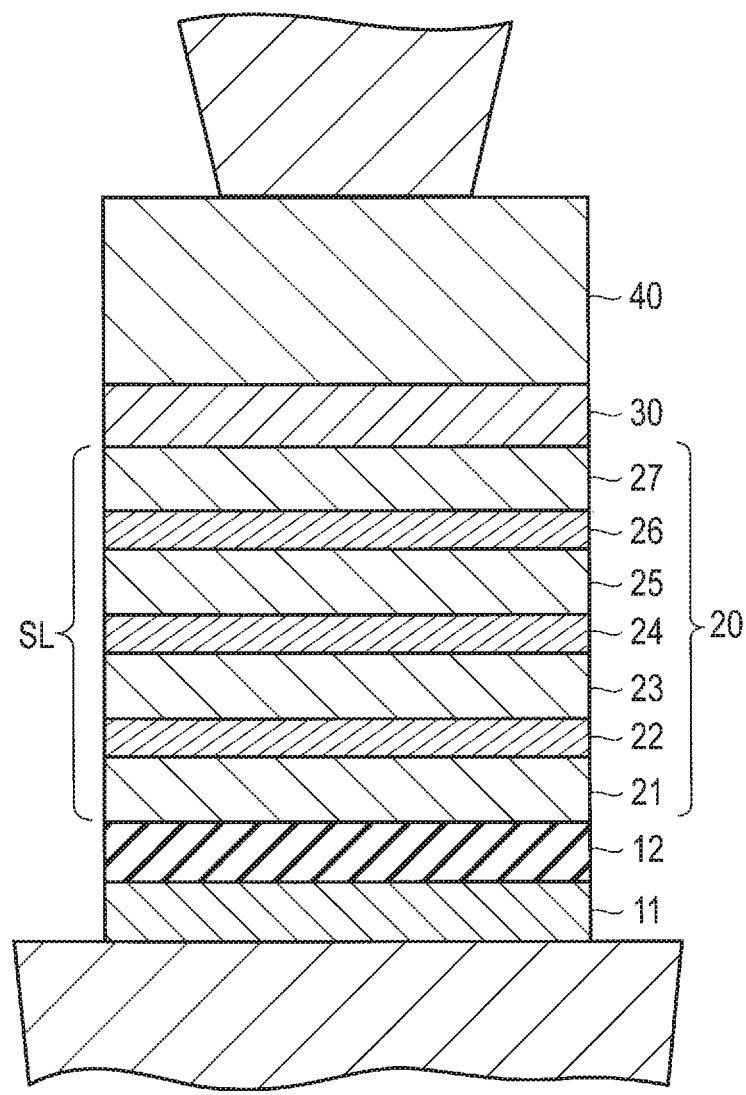
FIG. 12 is a cross-sectional view showing a modification of the third embodiment.

The point in which the present embodiment is different from the first and second embodiments is that a plurality of middle layers are provided. In other words, a storage layer 20 is formed such that it is constituted of more than three layers. More specifically, the storage layer 20 has a five-layer structure including a first magnetic material layer 21, a first middle layer 22, a second magnetic material layer 23, a second middle layer 24, and a third magnetic material layer 25. The middle layers 22 and 24 are formed of Mo or W, and an underlayer 12 is a nitrogen compound or an oxygen compound, or a mixture of these compounds. Note that the number of middle layers is not limited to two, and may be three or more so that the storage layer 20 as a whole is formed of seven layers or more. FIG. 12. shows an example of a case in which the number of the middle layers is three, and the number of the storage layers is seven. In FIG. 12, reference number 26 denotes a third middle layer, and reference number 27 denotes a fourth magnetic material layer.

Even with such a structure, an advantage similar to those of the first and second embodiments can surely be obtained. Also, in the present embodiment, by providing a plurality of middle layers, i.e., the middle layers 22 and 24, in the storage layer 20, the second magnetic material layer 23 is sandwiched between the middle layers without contacting an underlayer 12. In this case, since the second magnetic material layer 23 is not crystallized, saturation magnetization Mst is reduced. Therefore, there is an advantage that an activation volume is increased, and the thermal stability Δ is increased.

Fourth Embodiment

Figure 13:
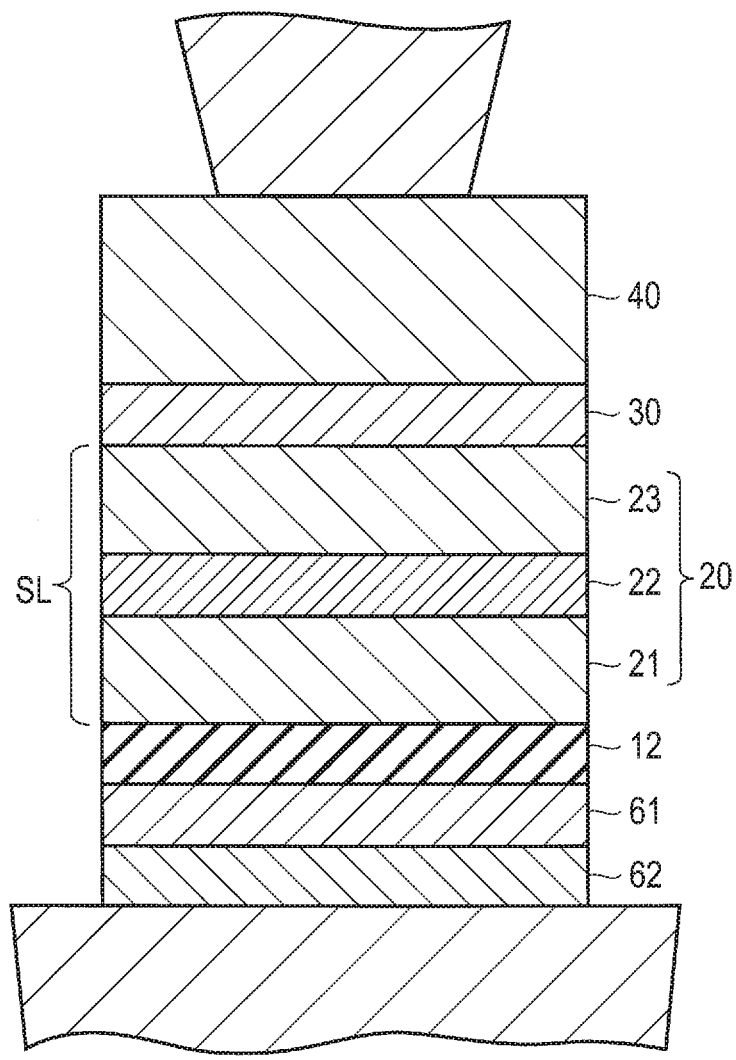
FIG. 13 is a cross-sectional view showing a structure of a memory cell portion of a magnetoresistive memory device of a fourth embodiment.

FIG. 13 is a cross-sectional view showing the structure of an MTJ element portion used in a magnetoresistive memory device according to a fourth embodiment. It should be noted that the same portions as those of FIG. 4 will be given the same reference numbers, and detailed explanations of them will be omitted.

The point in which the present embodiment is different from the first and second embodiments is that two buffer layers, i.e., buffer layers 61 and 62, are provided beneath an underlayer 12.

On a bottom electrode (BEC) connected to a drain region of a select transistor, a first buffer layer (BuL1) 61 and a second buffer layer (BuL2) 62 are stacked. Preferably, the material of the second buffer layer 62 on the lower side should be amorphous, or a material which does not inhibit the amorphous property of the buffer layer 61. It is sufficient if the second buffer layer 62 on the lower side is one which has a small lattice mismatching with the underlayer 12 in order to form the underlayer 12 with good crystallinity. More specifically, the same material as that used for the buffer layer 11 described in the first embodiment can be used. It suffices that the first buffer layer 61 on the upper side is one which includes W or Mo in Co and Fe in order for it to be amorphous. For example, W or Mo is added to CoFeB alloy.

Figure 14:
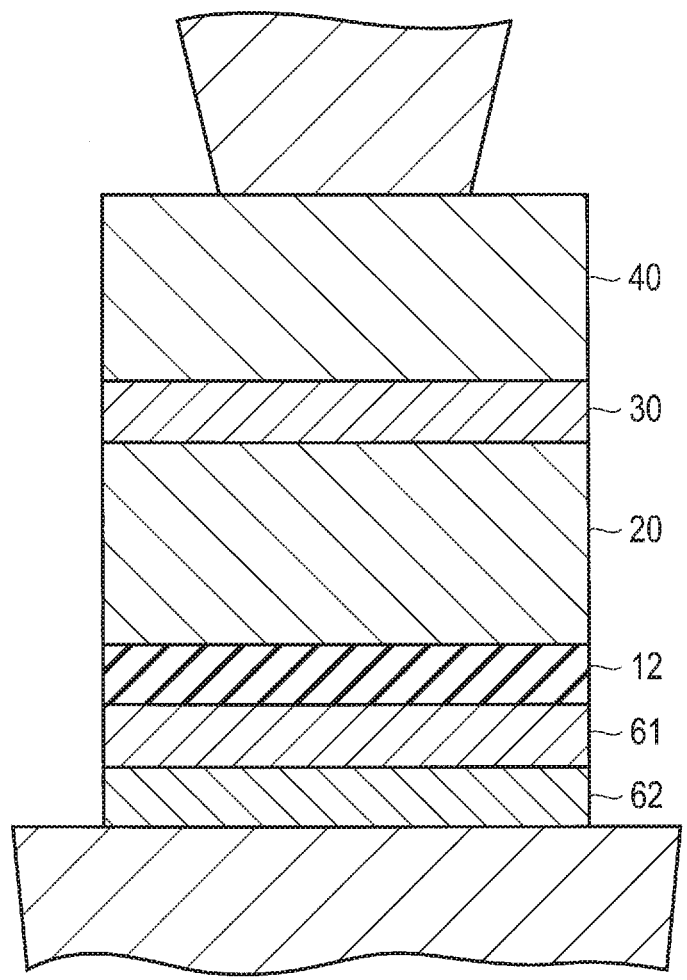
FIG. 14 is a cross-sectional view showing a structure of a memory cell portion according to a modification of the fourth embodiment.

On the buffer layer 61, the underlayer 12 is formed. The underlayer 12 is, for example, an oxygen compound or a mixture thereof. Further, on the underlayer 12, as in the first embodiment, a storage layer 20 (SL [first magnetic layer]), a tunnel barrier layer 30, and a reference layer 40 are formed. As in the first or second embodiment, the storage layer 20 has a stacked layer structure in which a middle layer 22 formed of Mo or W is sandwiched between magnetic material layers 21 and 23 of CoFeB. Moreover, the storage layer 20 is not necessarily limited to a stacked layer structure, and may be a single-layer alloy of CoFeBMo, for example, or a single-layer alloy of CoFeBW, for example, as shown in FIG. 14, may be adopted. Further, the storage layer 20 is not necessarily limited to one which includes Mo or W, and it may be a single magnetic layer of CoFeB or CoFe, etc., without a middle layer.

As in the present embodiment, by providing the amorphous buffer layer 61, the orientation of the underlayer 12 can be improved. When the orientation of the underlayer 12 is improved, the crystallinity of CoFeB formed thereon is improved. In this way, the element characteristics can be improved.

Here, by the form of a layer beneath the underlayer 12, saturation magnetization or an anisotropic magnetic field of the MTJ element portion show different values. Hence, the saturation magnetization Mst and the anisotropic magnetic field Hk have been verified for three cases where (a) when only the second buffer layer 62 is provided beneath the MgO underlayer 12, (b) when a stacked layer structure of CFB and the second buffer layer 62 is provided, and (c) when a stacked layer structure of CFB—W (alloy in which W is added to CFB: first buffer layer 61) and the second buffer layer 62 is provided. FIGS. 15 and 16 show the results.

As shown in FIG. 15, in case (b) corresponding to the stacked layer structure of CFB and the second buffer layer 62, the saturation magnetization Mst is great since the buffer layers are magnetic materials. In contrast, when W is added to the CFB (case c), since the buffer layers become nonmagnetic, the saturation magnetization can be made small.

Also, as shown in FIG. 16, as compared to case (a) where only the second buffer layer 62 is provided beneath the MgO underlayer 12, in case (b) corresponding to the stacked layer structure of CFB and the second buffer layer 62, the anisotropic magnetic field Hk is increased. Further, when W is added to the CFB (case c), the anisotropic magnetic field Hk is further increased. It has been found that also in a case where Mo is added to CFB, the characteristics tend to be similar to those indicated in FIGS. 15 and 16.

In view of the foregoing, anisotropy of the storage layer 20 is maintained by providing the first buffer layer 61 and the second buffer layer 62 beneath the underlayer 12. Further, since the buffer layers are nonmagnetic, the buffer layers do not adversely affect a write current to the storage layer 20 or a stability factor.

FIG. 17 shows the relationship between the ratio of W or Mo in the buffer layer 61 and the saturation magnetization Mst. In order to make Mst of the buffer layer 61 sufficiently small, the ratio of W or Mo should preferably be 30 atm % or more. However, if the buffer layer 61 is crystallized as a result of too high a ratio of W or Mo, the MgO underlayer 12 is crystallized in an undesired orientation. Accordingly, the ratio of W or Mo may be set at a level which allows the buffer layer 61 to maintain the amorphous state.

Also, the magnetic material in the buffer layer 61 is not limited to CoFeB, and various magnetic materials can be used. For example, CoB or FeB can also be used.

As can be seen, according to the present embodiment, by providing the second buffer layer 62 and the amorphous first buffer layer 61 beneath the underlayer 12, the underlayer 12 can be crystalline-oriented, and the crystallinity of the storage layer 20 can be improved. Thereby, the element characteristics of the magnetoresistive memory device can be improved.

Note that even if a nitrogen compound or an oxygen compound other than MgO, or a mixture of such compounds is used as the underlayer 12, an advantage of improving the orientation of the underlayer 12 achieved by forming two buffer layers can be obtained.

Fifth Embodiment

Figure 18:
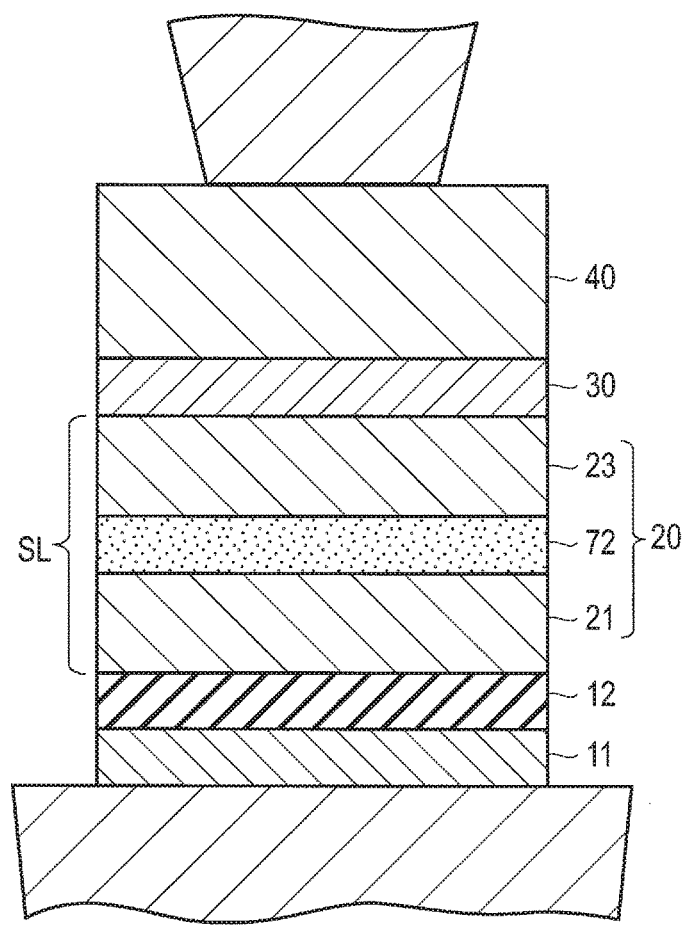
FIG. 18 is a cross-sectional view showing a structure of a memory cell portion used in a magnetoresistive memory device according to a fifth embodiment.
Figure 19:
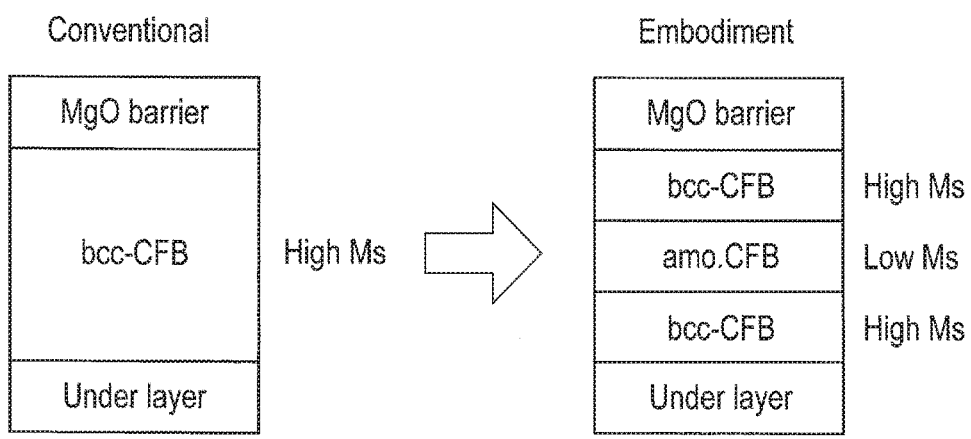
FIG. 19 is a schematic diagram showing a structure of an MTJ element portion of FIG. 18 in comparison with a comparative example.

FIG. 18 is a cross-sectional view showing the structure of a memory cell portion used in a magnetoresistive memory device according to a fifth embodiment. It should be noted that the same portions as those of FIG. 4 will be given the same reference numbers, and detailed explanations of them will be omitted. Also, FIG. 19 schematically shows a difference between an MTJ element portion shown in FIG. 18 and a comparative example.

The point in which the present embodiment is different from the first embodiment described above is that a magnetic material layer 72 formed of amorphous CoFeB is used instead of the middle layer 22. That is, an underlayer (UL) 12 is provided on a bottom electrode (BEC) via a buffer layer (BuL) 11. On the underlayer 12, a storage layer 20 (SL [first magnetic layer]) in which the amorphous magnetic material layer 72 is sandwiched between crystalline magnetic material layers 21 and 23 is formed. That is, the storage layer 20 in which three layers, i.e., layers 21, 72, and 23, are stacked is formed. Further, a reference layer 40 is formed on the magnetic material layer 23 via a tunnel barrier layer 30.

Here, the magnetic material layers 21 and 23 are formed of crystalline CoFeB, and the barrier layer 30 is formed of MgO, AlO, MgAlO, or ZnO. The CoFeB of the magnetic material layers 21 and 23 is a crystalline material of bcc (001) orientation, and the concentration of B is greater than or equal to 0 at % and less than or equal to 30 at %. CoFeB of the magnetic material layer 72 is an amorphous material having less crystallinity than the magnetic material layers 21 and 23, and the concentration of B is 0 to 30 at %. Note that as the magnetic material layers 21 and 23 and the barrier layer 30, various materials described in the first embodiment can be used. Further, as the underlayer 12, various materials described in the first embodiment can be used.

In order to improve retention of the storage layer 20 of the MTJ element portion and reduce a write current, it is necessary to reduce the saturation magnetization Mst of the storage layer 20. However, if the Mst is simply reduced, the TMR and perpendicular magnetic anisotropy are adversely affected. The CoFeB used for the storage layer 20 is crystallized from the amorphous state at the time of film formation when subjected to heat treatment, and a high TMR and perpendicular magnetic anisotropy are exhibited. That is, preferably, an interface between the barrier layer 30 and the underlayer 12 should be structured such that the TMR and the perpendicular magnetic anisotropy are maintained by the crystalline CoFeB, and the Mst is reduced by arranging the amorphous CoFeB as the middle layer of the storage layer 20.

Further, in order to form the storage layer 20 with bcc-CFB and amorphous CFB separately, the concentration of B may be adjusted. Generally, when the concentration of B is greater than or equal to 0 at % and less than or equal to 30 at %, a region which is crystallized is greater than a region which is amorphous. When the concentration of B is 25 at % or more, the amorphous region is greater. In the range of 25 to 30 at %, according to the condition of crystallization, a crystallized region and an amorphous region are mixed.

As can be seen, in the present embodiment, by using crystalline CoFeB for the magnetic material layers 21 and 23 of the storage layer 20, and using amorphous CoFeB for the magnetic material layer 72 in the middle, it is possible to reduce the saturation magnetization Mst in the storage layer 20 while maintaining the TMR and the perpendicular magnetic anisotropy.

FIG. 20 is a further improvement of the present embodiment, and the difference is that a nonmagnetic material layer is provided between amorphous CoFeB and crystalline CoFeB. That is, in addition to the structure illustrated in FIG. 18, a nonmagnetic material layer 71 formed of W, etc., is inserted between the magnetic material layer 21 formed of crystalline CoFeB and the magnetic material layer 72 formed of amorphous CoFeB, and a nonmagnetic material layer 73 formed of W, etc., is inserted between the magnetic material layer 72 formed of amorphous CoFeB and the magnetic material layer 23 formed of crystalline CoFeB.

Here, as the nonmagnetic material layers 71 and 73, a high-melting point material such as W, Mo, or Ta should preferably be used. In this example, by inserting the nonmagnetic material layers 71 and 73, a difference between crystallinity of the crystalline layer and the amorphous layer can be exhibited.

Figure 21:
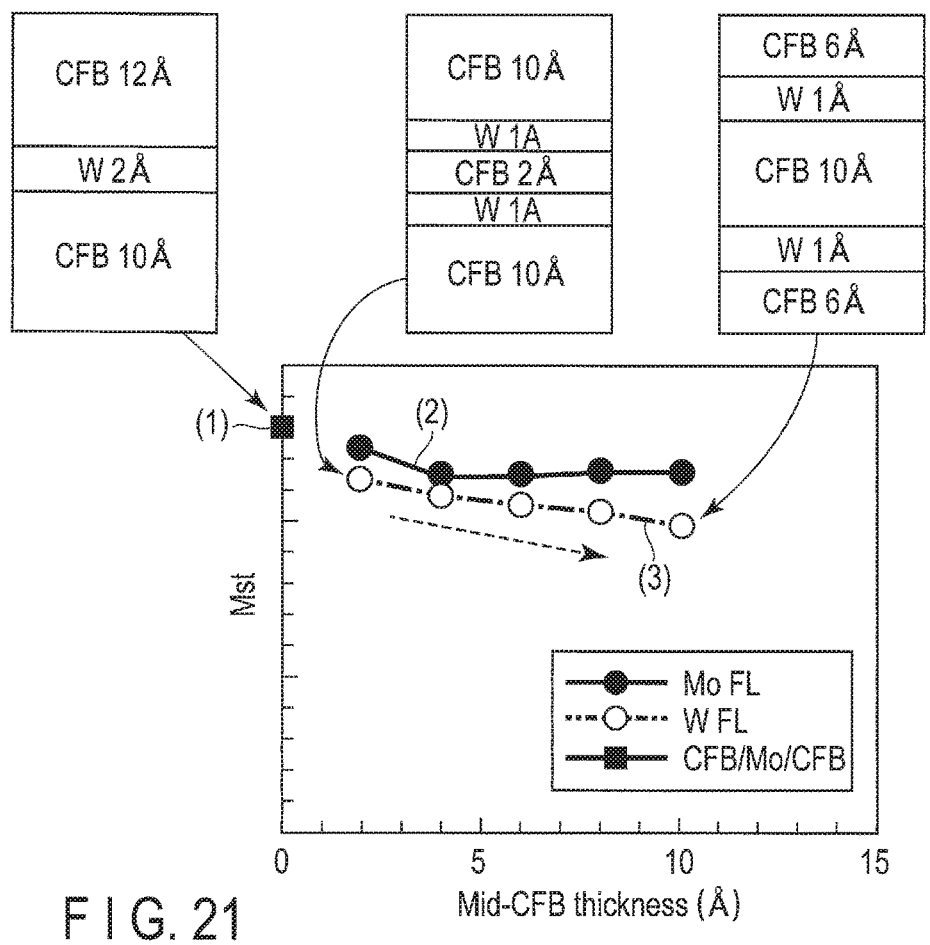
FIG. 21 is a characteristic diagram showing the relationship between a thickness of a magnetic material layer and saturation magnetization Mst of a storage layer.
Figure 22:
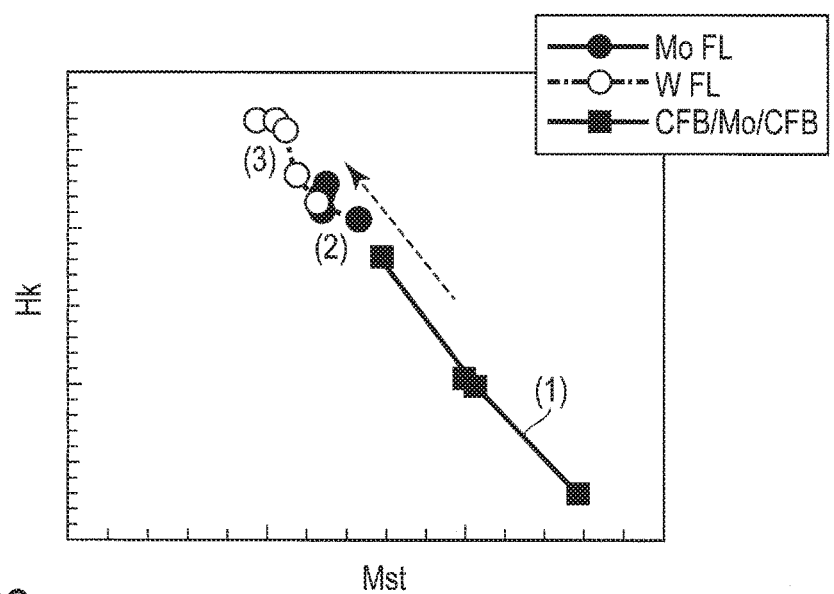
FIG. 22 is a characteristic diagram showing the relationship between saturation magnetization Mst and anisotropic magnetic field Hk.

FIG. 21 is a characteristic diagram showing the relationship between the thickness of the magnetic material layer 72 and the saturation magnetization of the storage layer 20 multiplied by the film thickness ("saturation magnetization× film thickness")[Mst]. Here, [Mst] in FIG. 21 is product of the saturation magnetization of the storage layer 20 and the film thickness of the storage layer 20. FIG. 22 is a characteristic diagram showing the relationship between the saturation magnetization multiplied by the film thickness and the anisotropic magnetic field Hk. In the drawing, (1) corresponds to a case where only the nonmagnetic material layer is provided without the magnetic material layer 72, (2) corresponds to a case where the nonmagnetic material layers 71 and 73 are formed of Mo, and (3) corresponds to a case where the nonmagnetic material layers 71 and 73 are formed of W.

As shown in FIG. 21, as compared to (1) in which no magnetic material layer 72 is provided, Mst can be reduced in (2) and (3) including CoFeB. The nonmagnetic material layers 71 and 73 being formed of W can more reduce the saturation magnetization multiplied by the film thickness than the nonmagnetic material layers 71 and 73 being formed of Mo. Also, as shown in FIG. 22, the smaller the saturation magnetization Mst is, the greater the anisotropic magnetic field Hk is. However, a structure in which the nonmagnetic material layers 71 and 73 are arranged respectively between the middle magnetic material layer 72 and the magnetic material layer 21, and between the middle magnetic material layer 72 and the magnetic material layer 23 can more increase the anisotropic magnetic field Hk. Accordingly, by adopting the structures of (2) and (3), the saturation magnetization can be reduced without degrading the magnetic anisotropy.

Sixth Embodiment

Figure 24A:
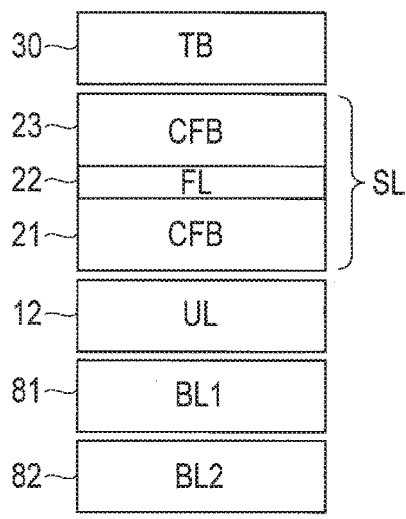
FIGS. 24A and 24B are diagrams schematically showing a structure of the MTJ element portion of FIG. 23.
Figure 24B:
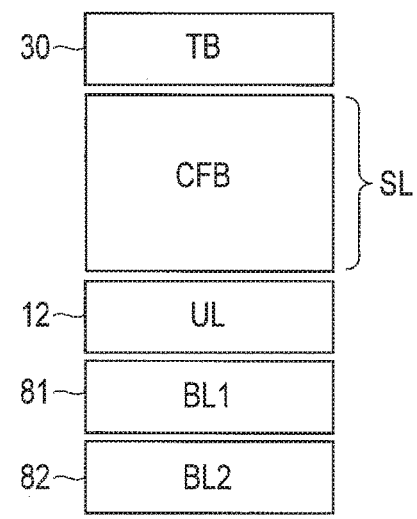

FIG. 23 is a cross-sectional view showing the structure of an MTJ element portion used in a magnetoresistive memory device according to a sixth embodiment. It should be noted that the same portions as those of FIG. 4 will be given the same reference numbers, and detailed explanations of them will be omitted. Also, the schematic structure of the MTJ element portion is shown in FIGS. 24A and 24B. FIG. 24A shows an example in which an SL is formed of three layers indicated as 21 to 23, and FIG. 24B shows an example in which the SL is formed of a single layer.

The point in which the present embodiment is different from the first and the second embodiment is that two buffer layers, i.e., buffer layers 81 and 82, are provided below an underlayer 12. Further, the point in which the present embodiment is different from the fourth embodiment is that amorphous Mo is used for the buffer layer 81.

On a bottom electrode (BEC) connected to a drain region of a select transistor, a first buffer layer (BuL1) 81 and a second buffer layer (BuL2) 82 are stacked. The buffer layer 81 on the upper side should preferably be amorphous, and is formed of, for example, Mo. The amorphous Mo is realized by adding a semimetal element such as B or Si to Mo, or by a thin layer of Mo before being subjected to crystal growth of 10Å or so.

Preferably, the material of the buffer layer 82 on the lower side should be amorphous, or a material which does not inhibit the amorphous property of the buffer layer 81. More specifically, the same material as that of the buffer layer 11 described in the first embodiment can be used.

On the buffer layer 81, the underlayer 12 is formed. The underlayer 12 is an oxygen compound, which is MgO, for example. Further, on the underlayer 12, as in the first embodiment, a storage layer 20 (SL [first magnetic layer]), a tunnel barrier layer 30, and a reference layer 40 are formed. Likewise the first or the second embodiment, the storage layer 20 has a stacked layer structure in which a middle layer 22 formed of Mo or W is sandwiched between magnetic material layers 21 and 23 of CoFeB.

Further, the storage layer 20 is not necessarily limited to a stacked layer structure, and may be a single-layer alloy of CoFeBMo, for example, or a single-layer alloy of CoFeBW, for example. Furthermore, the storage layer 20 is not necessarily limited to one which includes Mo or W, and it may be a single magnetic layer of CoFeB or CoFe, etc.

As in the present embodiment, by providing the buffer layer 81 of amorphous Mo, the orientation of the MgO underlayer 12 can be improved. When the orientation of the MgO underlayer 12 is improved, the crystallinity of CoFeB formed thereon is improved. In this way, the element characteristics can be improved. When amorphous Mo is used for the buffer layer 81, if the thickness is around 10 Å, substantially the same level of anisotropic magnetic field Hk as CoFeBMo can be obtained.

When MgO is used for the underlayer 12 of the storage layer 20 of the MTJ element portion, perpendicular magnetic anisotropy PMA is developed from both of the two interfaces of the storage layer 20, and retention can be improved. Since the PMA is improved in accordance with (001) orientation of the NaCl structure of the MgO underlayer, a material of the buffer layer of the MgO underlayer 12, in particular, the buffer layer 81 immediately below the MgO underlayer 12 is important. While using quarternary alloy (CFB—Mo) obtained by adding Mo to CoFeB as in the fourth embodiment can improve the orientation of the MgO underlayer 12, a similar advantage can also be obtained with a single layer as in the present embodiment. The Mo buffer layer 81 should preferably be amorphous, and can be realized by adding a semimetal element such as B or Si to Mo, or by a thin layer of Mo before being subjected to crystal growth of approximately 10 to 30 Å.

Note that the underlayer 12 is not necessarily limited to MgO, and it is expected that a similar advantage can be obtained as long as the underlayer 12 is an oxide.

As described above, in the present embodiment, likewise the fourth embodiment which has already been explained, the element characteristics of the magnetoresistive memory device can be improved. Further, there is also an advantage that the parasitic resistance of the MgO underlayer is reduced, and the TMR may be improved when the buffer layer 81 of Mo is used as in the present embodiment, as compared to a case where the buffer layer 61 formed of CoFeBMo is used as in the fourth embodiment.

(Modification)

Note that the embodiments are not limited to those described above.

Figure 25:
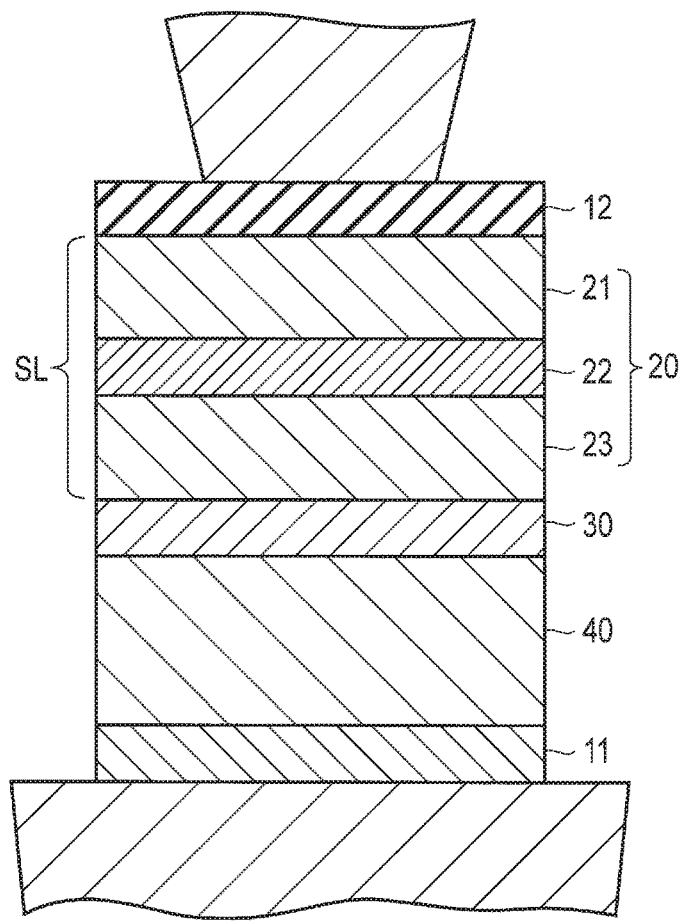
FIG. 25 is a cross-sectional view showing a structure of a memory cell portion according to a modification.

In the present embodiments, the storage layer 20 is arranged on the side of the substrate, and the reference layer 30 is arranged on the opposite side. However, the positional relationship between these layers may be made opposite, as shown in FIG. 25. The underlayer 12 is not necessarily provided on a substrate 10, and it is sufficient if the underlayer 12 contacts the storage layer 20.

In the first to third embodiments, when the underlayer 12 can be formed with good crystallinity even if the buffer 11 is not provided, the buffer layer 11 can be omitted. Also, the number of middle layers in the storage layer 20 is not limited to one or two. That is, three or more middle layers may be provided.

In the fourth embodiment, when the crystallinity of the underlayer 12 is sufficiently good even if the second buffer layer 62 is not provided, the second buffer layer 62 can be omitted. Further, in a case where the crystallinity of the underlayer 12 is improved and sufficient characteristics as the storage layer 20 can be obtained by simply providing the first buffer layer 61, the storage layer 20 may be formed as a single layer, instead of forming it into stacked layer structure. Also, in order to make the buffer layer amorphous, CFB may be mixed into W or Mo, instead of adding W or Mo to a magnetic material of CFB, etc. Furthermore, as long as the buffer layer can be formed amorphous, Mo or a material including Mo as the main component may be used.

In addition, the material of each layer is not limited to that described in the above embodiments, and can be changed as appropriate according to the specification. Further, the film thickness of each layer can be changed as appropriate according to the specification.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive memory device comprising:
a first magnetic layer having a variable magnetization direction, the first magnetic layer including Mo;
a first nonmagnetic layer provided on the first magnetic layer;
a second magnetic layer provided on the first nonmagnetic layer, a magnetization direction of the second magnetic layer being invariable; and
a second nonmagnetic layer provided on the first magnetic layer, which is opposite the first nonmagnetic layer.

2. The device of claim 1, wherein:
the first magnetic layer is a storage layer having magnetic anisotropy perpendicular to a film surface;
the second magnetic layer is a reference layer having magnetic anisotropy perpendicular to a film surface; and
the first nonmagnetic layer is a tunnel barrier layer through which a tunneling current flows.

3. The device of claim 1, wherein the first nonmagnetic layer comprises MgO.

4. The device of claim 1, wherein the first and the second nonmagnetic layers are different materials.

5. The device of claim 1, wherein the first magnetic layer includes Fe or Co.

6. The device of claim 1, wherein the first magnetic layer has a stacked layer structure in which a middle layer including Mo is provided between magnetic material layers.

7. The device of claim 1, wherein the second nonmagnetic layer is an oxide.

8. The device of claim 6, wherein the first magnetic layer comprises a plurality of the middle layers.

9. The device of claim 1, further comprising a first layer on the second nonmagnetic layer, which is opposite the first magnetic layer.

10. The device of claim 9, further comprising a first electrode, and a second electrode provided on the second magnetic layer, wherein
the first layer is provided on the first electrode.

11. The device of claim 9, wherein the first layer includes at least one element selected from the group consisting of Al, Be, Mg, Ca, Sr, Ba, Sc, Y, La, Si, Zr, Hf, W, Cr, Mo, Nb, Ti, Ta, and V, or a boride of these elements.

12. A magnetoresistive memory device comprising:
a first magnetic layer having a variable magnetization direction, the first magnetic layer including Mo or W;
a first nonmagnetic layer provided on the first magnetic layer;
a second magnetic layer provided on the first nonmagnetic layer, a magnetization direction of the second magnetic layer being invariable; and
a second nonmagnetic layer of a nitrogen compound provided on the first magnetic layer, which is opposite the first nonmagnetic layer.

13. The device of claim 12, wherein:
the first magnetic layer is a storage layer having magnetic anisotropy perpendicular to a film surface;
the second magnetic layer is a reference layer having magnetic anisotropy perpendicular to a film surface; and
the first nonmagnetic layer is a tunnel barrier layer through which a tunneling current flows.

14. The device of claim 12, wherein the first magnetic layer includes Fe or Co.

15. The device of claim 12, wherein the first magnetic layer has a stacked layer structure in which a middle layer including Mo or W is provided between magnetic material layers.

16. A magnetoresistive memory device comprising:
a first magnetic layer having a variable magnetization direction;
a first nonmagnetic layer provided on the first magnetic layer;
a second magnetic layer provided on the first nonmagnetic layer, a magnetization direction of the second magnetic layer being invariable;
a second nonmagnetic layer provided on the first magnetic layer, which is opposite the first nonmagnetic layer; and
a first layer comprising a magnetic material and a nonmagnetic material, the first layer provided on the second nonmagnetic layer, which is opposite the first magnetic layer.

17. The device of claim 16, wherein the first nonmagnetic layer comprises MgO, and the second nonmagnetic layer comprises MgO.

18. The device of claim 16, wherein the first magnetic layer has a stacked layer structure in which a middle layer including Mo or W is provided between magnetic material layers.

19. The device of claim 16, wherein the first layer includes Co or Fe as the magnetic material and W or Mo as the nonmagnetic material, and the first layer is amorphous.

20. The device of claim 16, further comprising a second layer on the first layer, which is opposite the second nonmagnetic layer, wherein
the second layer includes at least one element selected from the group consisting of Al, Be, Mg, Ca, Sr, Ba, Sc, Y, La, Si, Zr, Hf, W, Cr, Mo, Nb, Ti, Ta, and V, or a boride of these elements.

21. The device of claim 16, wherein:
the first magnetic layer is a storage layer having magnetic anisotropy perpendicular to a film surface;
the second magnetic layer is a reference layer having magnetic anisotropy perpendicular to a film surface; and
the first nonmagnetic layer is a tunnel barrier layer through which a tunneling current flows.

* * * * *